United States Patent [19]
Sumi

[11] Patent Number: 5,428,234
[45] Date of Patent: Jun. 27, 1995

[54] SEMICONDUCTOR DEVICE

[75] Inventor: Hirofumi Sumi, Kanagawa, Japan

[73] Assignee: Sony Corporation, Tokyo, Japan

[21] Appl. No.: 305,975

[22] Filed: Sep. 16, 1994

Related U.S. Application Data

[63] Continuation of Ser. No. 89,559, Jul. 12, 1993, abandoned.

[30] Foreign Application Priority Data

Jul. 20, 1992 [JP] Japan ................... 4-213239

[51] Int. Cl.⁶ ............................................. H01L 29/68
[52] U.S. Cl. ................................. 257/287; 257/335; 257/345; 257/404; 257/902
[58] Field of Search ............... 257/287, 335, 345, 349, 257/399, 400, 404, 902

[56] References Cited

U.S. PATENT DOCUMENTS 4,631,563  12/1986  Iizuka ......................... 257/902

FOREIGN PATENT DOCUMENTS 61-97964  5/1986  Japan .......................... 257/349

OTHER PUBLICATIONS

V. P. Kesan et al., "High Performance 0.25 μm p-MOSFETs with Silicon–Germanium Channels for 300K and 77K Operation", *IEEE*, 1991, pp. 25–28, Jan. 1991.

G. L. Patton et al., "SIGe-Base Heterojunction Bipolar Transistors: Physics and Design Issues", *IEEE*, 1990, pp. 13–16.

D. R. Hamann, "New Silicide Inteface Model from Structural Energy Calculations", *Physical Revice Letters*, vol. 60, No. 4, Jan. 1988, pp. 313–316.

*Primary Examiner*—Edward Wojciechowicz
*Attorney, Agent, or Firm*—Hill, Steadman & Simpson

[57] ABSTRACT

A semiconductor device which comprises a semiconductor substrate having thereon a channel region, said channel region comprising (A) a channel, and (B) a metallic layer or a compound layer of a metal with a constituent material of the semiconductor substrate, provided that at least a part of said metallic layer or said compound layer is included in said channel. The semiconductor device has stable characteristics with high operation speed, and yet, is capable of being fabricated by a simple process.

13 Claims, 14 Drawing Sheets

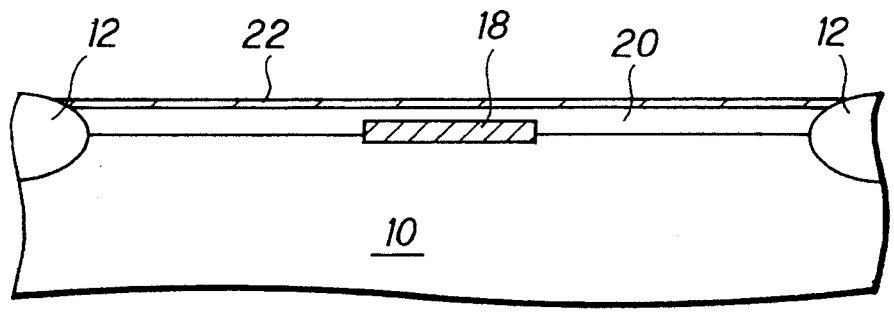
FIG.3(A)
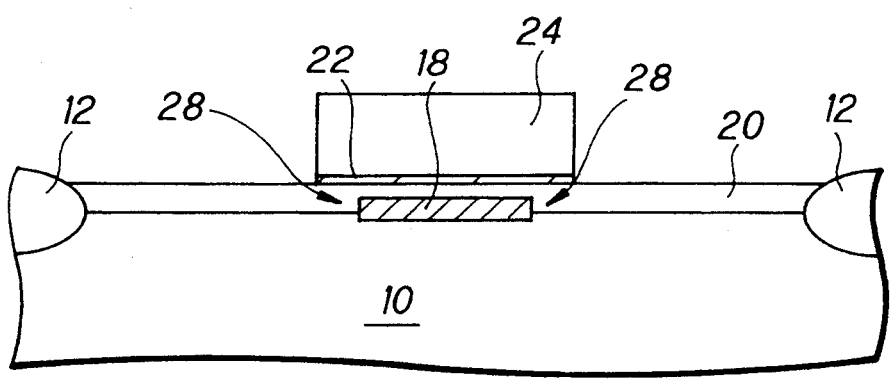
FIG.3(B)
FIG.3(C)
 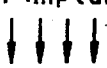
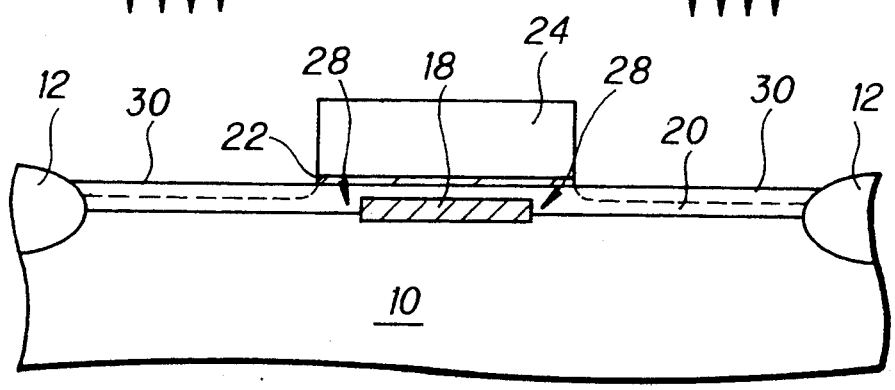

FIG.6(B) Ion implantation

SEMICONDUCTOR DEVICE

This is a continuation of application Ser. No. 08/089,559 filed Jul. 12, 1993 now abandoned.

BACKGROUND OF THE INVENTION

1. Field of the Invention

The present invention relates to a semiconductor device. More specifically, it relates to a semiconductor device comprising a transistor element having quick response.

2. Prior Art

With the increase in degree of integration, still finer semiconductor elements for heavily integrated semiconductor devices are actively developed. MOS (metal-oxide-semiconductor) devices, which are dominant at present, are generally fabricated through process steps illustrated in FIG. 14.

[Process step 10]

Referring to FIG. 14(A), an element isolation region 12 is formed on a semiconductor substrate 10. Then, a gate contact area comprising an oxide film 14 and a polysilicon layer 24 is established on the surface of the semiconductor substrate 10.

[Process step 20]

Referring to FIG. 14(B), an LDD (lightly doped drain) structure is obtained by forming a side wall 34 on the side wall of the polysilicon layer 24 after establishing lightly doped shallow source.drain areas. Source.drain areas 36 are established by further subjecting the structure to ion implantation.

[Process step 30]

In the step illustrated in FIG. 14(C), an interlevel insulator layer 40 is formed, followed by providing an opening 42 therein, and by further establishing a connection layer 44.

Semiconductor devices are currently fabricated by a process comprising steps as described above. Recently, however, transistor elements operating at a higher speed are desired because of, for example, the demand for a further increased integration of logic circuits. AMOS transistor element with higher switching rate can be implemented by (A) shortening the channel length, and (B) increasing carrier mobility in the channel region.

A shorter channel length can be realized only with a progress in the technology of lithography. The formation of a fine resist pattern is requisite for a fine gate, i.e., a channel with a very short length. The minimum pattern length attainable at present in a process for mass production is about 0.5 $\mu$m.

Furthermore, the so-called short channel effect becomes apparent with decreasing channel length. This effect results in the failure of attaining a desired threshold voltage, which further leads to problems such as an increase of power consumption and an unattainment of the expected characteristics as a transistor element. Moreover, when the short channel effect is particularly intense, punch thorough occurs that it becomes impossible to control of the current with gate voltage.

Recently, a method which comprises establishing SiGe in the base region is proposed as a means for increasing mobility of a Si-based transistor. It is generally accepted that the mobility of Ge is higher than that of Si. Accordingly, the formation of SiGe in the base region of a bipolar transistor increases the switching speed of the transistor. A method which comprises forming SiGe in the channel of a PMOS transistor for increasing the speed of the transistor is disclosed in V. P. Kensan, et al., "High Performance 0.25 $\mu$m p-MOSFETs with Silicon-Germanium Channels for 300K and 77K Operation", International Electron Device Meeting (IEDM) 1991, Technical Digest pp. 25.

However, a drastic increase in the operation speed of a transistor cannot be expected even when an SiGe channel is incorporated. The average velocity v of the carriers which are involved in electric conduction is given by $$v = \mu E = \mu IR$$

where $\mu$ represents mobility, E is electric field, I is current, and R is resistance. Considering that the mobility of Ge is 3,900 as compared to 1,500 of Si, the increase in average velocity which can be expected by replacing Si by Ge is merely about 2.6 times the conventional value.

At present, SiGe channel is deposited using CVD epitaxial growth technology. However, when a junction of Si and Ge is formed, rectifying characteristics is lost because a valence band barrier is formed due to the difference in band gap between Si and SiGe (for reference, see G. L. Patton, et al., "SiGe-BASE HETEROJUNCTION BIPOLAR TRANSISTORS:PHYSICS AND DESIGN ISSUES", IEDM 1990, Technical Digest 2.1.1–2.1.4). Accordingly, a technique for controlling the band gap by adjusting the concentration of Ge in Si is required for overcoming this problem. In a CVD process, however, it is extremely difficult to precisely control the concentration of Ge in Si.

An object of the present invention is, therefore, to provide a semiconductor device having stable characteristics and a further improved operation speed, which can be easily fabricated by applying a conventional process for fabricating MOS transistors without carrying out complicated fabrication steps.

SUMMARY OF THE INVENTION

The object described in the foregoing can be achieved by a semiconductor device according to the present invention, which is characterized by that it comprises a semiconductor substrate having formed on the surface thereof a channel region comprising (A) a channel, and (B) a metallic layer or a compound layer comprising a compound of a metal with a constituent material of the semiconductor substrate, provided that at least a part of the layer is included in said channel.

Preferably, the metallic layer or the compound layer is capable of being grown epitaxially on the semiconductor substrate. The length of the metallic layer or the compound layer along the channel direction is preferably shorter than the effective length of the channel region. It is preferred that an intermediate region made of the same material as that constituting the semiconductor substrate is formed between the metallic layer or the compound layer and the source.drain regions which are provided neighboring to said layer. Furthermore, an impurity is favorably incorporated, preferably at a concentration of $1 \times 10^{17}$ cm$^{-3}$ or higher, into at least a part of the intermediate region to reduce Schottky barriers.

In the semiconductor according to the present invention, a transistor improved in response can be achieved by epitaxially growing, on the channel thereof, a metallic layer or a compound layer (more specifically, a silicide layer) having an electric conductivity higher than that of Ge. This can be explained theoretically as follows. In general, conductivity u is expressed by the following equation:

$$\sigma = nq\mu$$

where, n represents carrier density, q is the charge of the carrier, and μ is mobility. Because resistance R is proportional to the inverse of σ as $$R \propto 1/\sigma,$$

a larger σ can be attained by reducing the resistance R, by increasing the carrier density n, or by using a substance having a higher mobility σ in the channel.

It is well established that $CoSi_2$, which has lattice parameters concordant with those of Si, can be grown epitaxially on Si (see, for example, D. R. Hamann, "New Silicide Interface Mode from Structural Energy Calculation", Physical Review Letters 60 (No. 4, 25 Jan. 1988), pp. 313-316). The d-electron in the outer orbit as a consequence of valence bonding between Co and Si behaves like a free electron as in a metal. Accordingly, an extremely high electric conductivity is obtained for $CoSi_2$. In the semiconductor device according to the present invention, a metallic layer or a compound layer having grown epitaxially on the semiconductor substrate is formed on at least a part of the Si channel. Thus, a semiconductor element structure in which the carrier is accelerated at parts of the channel can be realized.

However, when a bulk metal is formed over the entire area of the channel, the transistor element remains turned ON because a metal never gives a depression region due to the presence of free electrons with which a metal is furnished. Accordingly, an Si intermediate region is formed on the both ends of the metallic layer or the compound layer having formed in a part of the channel, to thereby realize a depression state at those regions. In this manner, an OFF state can be obtained.

BRIEF DESCRIPTION OF THE DRAWINGS

FIG. 3(A)-FIG. 3(C) is a schematically shown cross sectional view of a semiconductor element, for use as an explanatory means for describing the process steps subsequent to those of FIG. 2 in the fabrication of a semiconductor device according to the present invention;

FIG. 6(A)-FIG. 6(C) is a schematically shown cross sectional view of a semiconductor element, for use as an explanatory means for describing the process steps in the fabrication of a semiconductor device according to a second embodiment of the present invention;

DETAILED DESCRIPTION OF THE INVENTION

Figure 1:
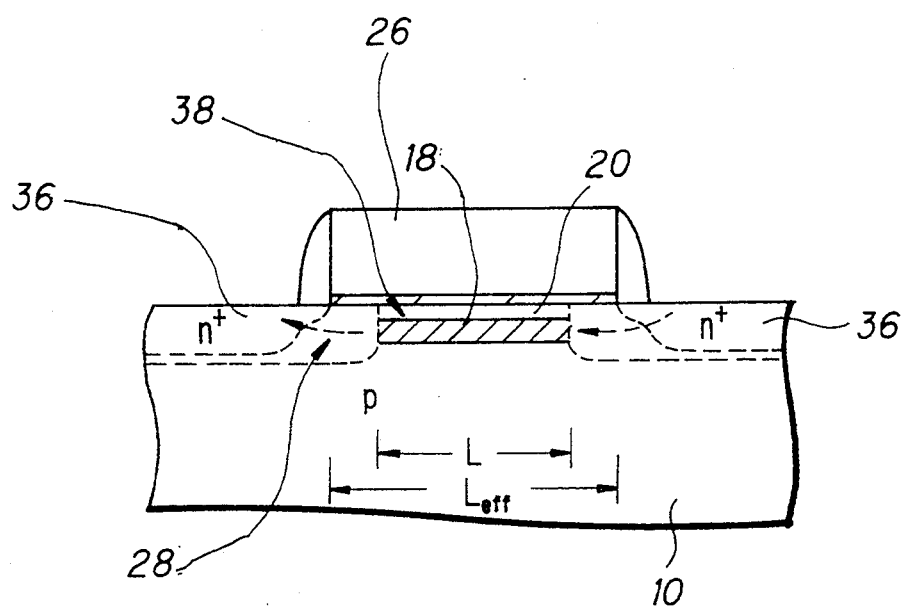
FIG. 1 is a schematically shown cross sectional view of a semiconductor device according to the present-invention, for use as an explanatory means for describing the structure and the mode of operation of the semiconductor device.
Figure 2A:
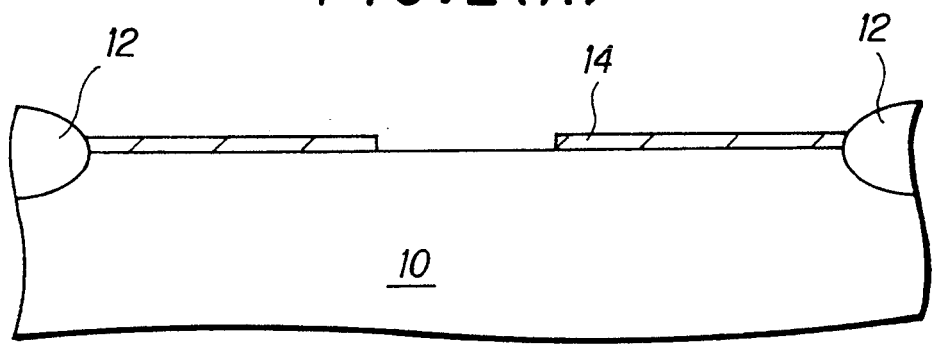
FIG. 2(A)-FIG. 2(C) is a schematically shown cross sectional view of a semiconductor element, for use as an explanatory means for describing the process steps in the fabrication of a semiconductor device according to an embodiment of the present invention.
Figure 2B:
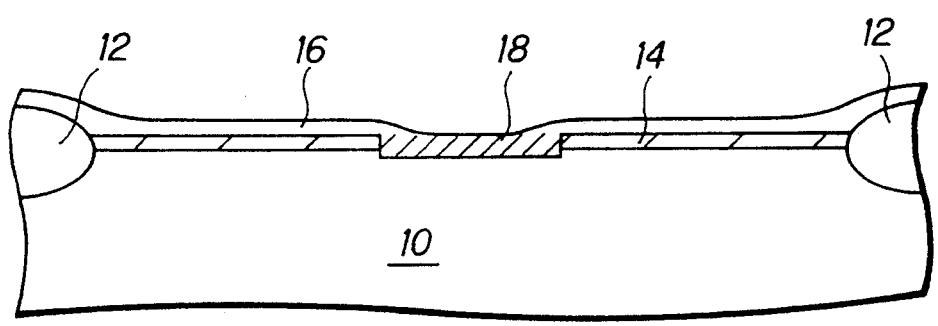
Figure 2C:
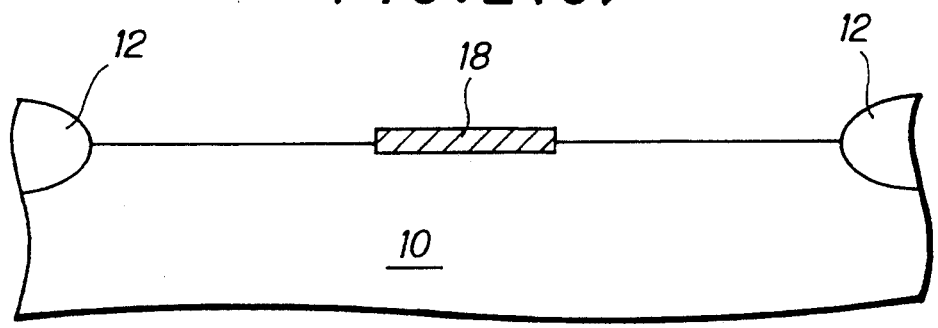

FIG. 1 shows a schematically drawn cross sectional view of a part of a semiconductor element in operation. The semiconductor device according to the present invention comprises a semiconductor substrate 10 having formed thereon a channel region 38 which comprises (A) a channel comprising a silicon film 20, and (B) a $CoSi_2$ layer 18 which at least a part thereof is included in said channel.

The length along the channel direction L of the compound layer comprising the $CoSi_2$ layer 18 is shorter than the effective length $L_{eff}$ of the channel region 38, and Si, which is a constituent material of the semiconductor substrate, is left in the intermediate region 28 between the $CoSi_2$ layer 18 and the source.drain region 36 neighboring thereto. Furthermore, an impurity is incorporated, for example, by oblique incident ion implantation, into at least a part of the intermediate region 28 to thereby lower the Schottky barrier. The impurity should be of the same type of impurity being incorporated in the semiconductor substrate material, e.g., Si. In FIG. 1 is shown a structure for an NMOS, but a PMOS structure can be obtained in a similar manner.

The present invention is illustrated in greater detail referring to non-limiting examples below with schematically drawn cross sections. It should be understood, however, that the present invention is not to be construed as being limited thereto.

EXAMPLE 1

The semiconductor device described in the present example comprises a channel containing at least a part of the layer of a compound from a metal (Co) and a constituent material (Si) of the semiconductor substrate. The compound layer comprises a cobalt silicide (CoSi$_2$) layer 18. The CoSi$_2$ layer is epitaxially grown in the semiconductor substrate. In the present example, the impurity was introduced into the intermediate region 28 by oblique incident ion implantation.

The process steps for fabricating the semiconductor device in the present example is explained briefly below referring to FIGS. 2 to 5.

[Process step 100 to Process step 120]

A compound (silicide) layer 18 was formed on an area defined as an area for forming later thereon a gate contact (referred to hereinafter as "an area assigned to a gate contact area") by reacting a metallic layer 16 and a constituent material (Si) of the substrate, and the compound (silicide) layer 18 was grown epitaxially on the semiconductor substrate 10. It this step, the length of the compound layer must be set shorter than the length defined for the gate contact area.

[Process step 130 to Process step 150]

A silicon film 20 which serves as a channel was deposited on the area assigned to the gate contact area, and a gate contact area was established thereafter.

[Process step 160]

Impurities were introduced by oblique incident ion implantation into an intermediate region 28 which is located between the compound layer 18 and the region neighboring thereto, i.e., the regions assigned to source.drain regions, to thereby minimize the Schottky barrier. The intermediate region 28 comprises Si, a constituent material of the semiconductor substrate.

The process for fabricating a semiconductor substrate based on the briefly described steps above is explained in further detail below.

[Process step 100]

Element isolation regions 12 were formed at first on a silicon semiconductor substrate 10 by an ordinary process. The entire surface of the resulting semiconductor substrate was subjected to oxidation at, for example, 850° C., to obtain an oxide film 14 at a thickness of 10 nm. Then, the oxide film was removed by resist patterning and ECR dry etching from particular areas for forming the CoSi$_2$ layer thereon in the subsequent step, to thereby expose a part of the semiconductor substrate 10. The ECR dry etching may be conducted, e.g., by flowing C$_4$F$_8$ gas at a flow rate of 50 sccm, under conditions set as to yield, e.g., a microwave power of 700 W, an RF power of 100 W, and a pressure of 1 Pa (See FIG. 2(A)). The oxide film 14 thus obtained functions as a mask during the deposition of a CoSi$_2$ layer in the subsequent step.

[Process step 110]

A 5 nm thick Co layer 16 was deposited by sputtering on the entire surface of the structure obtained above. The film deposition can be carried out, e.g., by applying an RF bias of −50 W under a DC sputtering power of 1 kW, while flowing Ar gas at a flow rate of 40 sccm and under a pressure of 0.4 Pa. Preferably, the semiconductor substrate is heated to about 800° C. during the deposition of Co. In this manner, at parts of the semiconductor substrate 10 from the surface of which the oxide layer 14 is removed, a CoSi$_2$ layer can be formed through reaction of Co and Si during Co deposition on Si, while simultaneously allowing the layer to grow epitaxially to the underlying Si. Thus was obtained an epitaxially grown CoSi$_2$ layer 18 on the underlying silicon substrate 10 to realize a structure shown in FIG. 2(B). In short, a layer of a compound (CoSi$_2$) obtained from a metal (Co) and a constituent material (Si) of the semiconductor substrate was established in this step. Alternatively, the CoSi$_2$ layer can be epitaxially grown from Co having deposited on the semiconductor substrate 10 by first depositing Co on the semiconductor substrate 10 and the oxide film 14, and then heating the semiconductor substrate. The CoSi$_2$ layer 18 is obtained in this manner on the area assigned to the gate contact area. It should be noted that the CoSi$_2$ layer is formed shorter in length than the area defined for the gate contact area.

[Process step 120]

After completion of the deposition of the Co layer 16, the semiconductor substrate was immersed into an aqueous solution of hydrochloric acid (HCl) and hydrogen peroxide (H$_2$O$_2$) containing HCl, H$_2$O$_2$, and H$_2$O at a HCl:H$_2$O$_2$:$_2$O ratio of 1:1:2 for a duration of 10 minutes, to thereby remove excess Co layer therefrom. Subsequently, the semiconductor substrate was further immersed into a dilute hydrofluoric acid (HF) containing HF and water at a HF:H$_2$O ratio of 1:100 for a duration of 1 minute to remove the oxide film 14. In this manner, a CoSi$_2$ layer 18 can be obtained on the surface of the semiconductor substrate shown in FIG. 2(C).

[Process step 130]

A 10 nm thick silicon epitaxial film 20 was grown selectively on the surface of Si and CoSi$_2$ layer 18 on the silicon semiconductor substrate having a partially exposed surface. The silicon film 20 may be deposited using a mixed gas of SiH$_4$ and H$_2$ each flown at a rate of 400 sccm and 80 l/minute, respectively, under a pressure of 10$^3$ Pa and at a temperature of 950° C. The silicon film 20 on the CoSi$_2$ layer serves as a channel in the channel region. The surface of the thus grown silicon film was oxidized to form a gate oxide film 22 to give a structure illustrated in FIG. 3(A). The gate oxide film 22 can be formed by flowing a gas mixture of H$_2$O and O$_2$ each at a flow rate of 1.5 l/minute and 6 l/minute, respectively, while maintaining the temperature at 850° C.

[Process step 140]

A 200 nm thick polysilicon layer 24 was deposited on the gate oxide film 22 to establish a gate electrode area. The polysilicon layer 24 can be deposited by, e.g., flowing a gas mixture of SiH$_4$, PH$_3$, and He each at a flow rate of 500 sccm, 0.35 sccm, and 50 sccm, respectively, while maintaining the temperature to 580° C. and the pressure to 1 Pa. The polysilicon layer 24 was etched thereafter to leave out a part of the polysilicon layer 24 which corresponds to the gate contact area. Thus was obtained a structure shown in FIG. 3(B). The etching can be conducted under a mixed gas flow of C$_2$Cl$_3$F$_3$ and SF$_6$ each flown at a rate of 65 sccm and 5 sccm, respectively, a microwave power of 700 W, an RF power of 100 W, and a pressure of 1.33 Pa.

The important point in this step is that the polysilicon layer 24 obtained after the etching step is longer in length than the CoSi$_2$ layer 18. That is, an intermediate region 28 comprising a constituent material (Si) of the semiconductor substrate, more specifically, an intermediate region 28 comprising a silicon film 20 and a semiconductor substrate 10, is established between the region assigned to source.drain regions and the CoSi$_2$ layer 18. By taking such a structure, a short circuit between the source and drain regions due to the presence of the CoSi$_2$ layer 18 can be prevented from occurring when the transistor is in the OFF state.

[Process step 150]

The structure thus obtained was then subjected to ion implantation to obtain an LDD (lightly doped drain) structure comprising lightly doped shallow source and drain regions 30 as in FIG. 3(C). The ion implantation process can be conducted by bombarding the structure, for example, with As+ at an energy of 40 KeV and at a fluence of $1 \times 10^{14}$ ions/cm$^2$ for an NMOS, or with BF$_2$+ at an energy of 30 KeV and at a fluence of $5 \times 10^{13}$ ions/cm$^2$ in the case of a PMOS.

[Process step 160]

Furthermore, a heavily doped region 32 including a part of the intermediate layer 28 was established by oblique incident ion implantation to minimize Schottky barrier between the CoSi$_2$ layer 18 having formed on the region assigned to the channel region and the surrounding Si. Thus was obtained a structure shown in FIG. 4(A). The ion implantation can be effected by, for example, implanting BF$_2$+ at an energy of 20 KeV and at a fluence of $1 \times 10^{15}$ ions/cm$^2$ for an NMOS, or As+ at an energy of 30 KeV and at a fluence of $5 \times 10^{15}$ ions/cm$^2$ in the case of a PMOS. The oblique incident ion implantation can be conducted by, for example, bombarding a semiconductor substrate being rotated at 30 rpm with ions at an incident angle of 60 degree. The ions are preferably implanted at a dose of $1 \times 10^{13}$ ions/cm$^2$ or more to facilitate electric contact between the CoSi$_2$ layer 18 and the surrounding Si. The impurity to be implanted must be the same type of impurity included in the well of the semiconductor substrate.

[Process step 170]

Figure 4A:
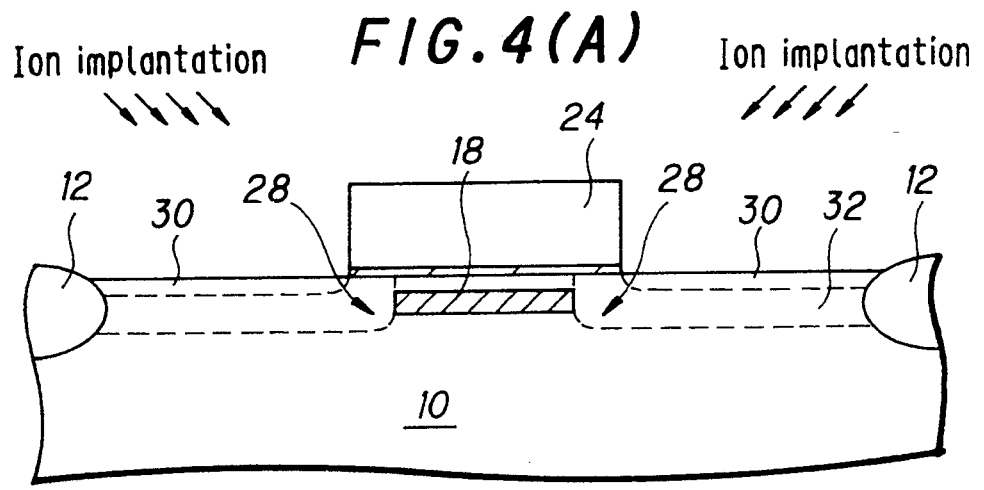
FIG. 4(A)-FIG. 4(C) is a schematically shown cross sectional view of a semiconductor element, for use as an explanatory means for describing the process steps subsequent to those of FIG. 3 in the fabrication of a semiconductor device according to the present invention.
Figure 4B:
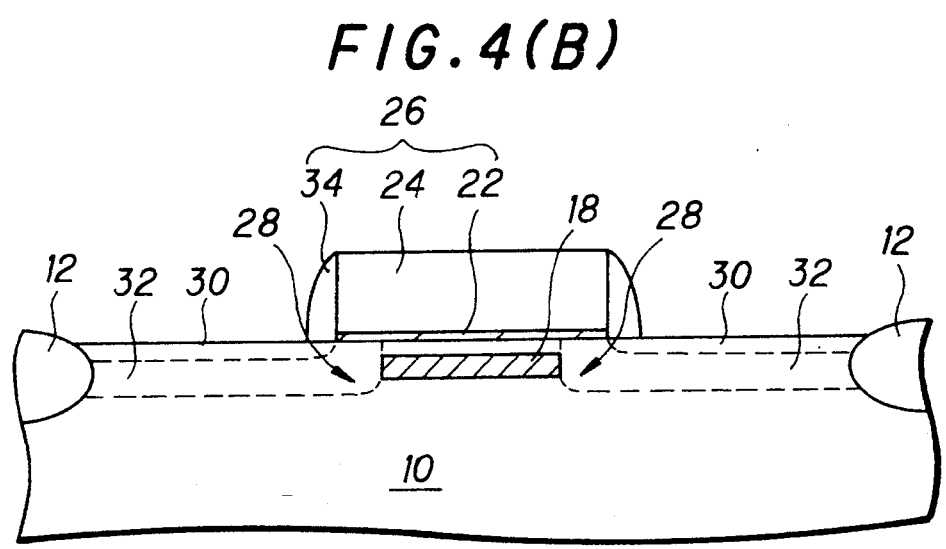

A 400 nm thick SiO$_2$ layer was deposited over the entire structure at 420° C. while flowing a mixed gas comprising SiH$_4$, O$_2$, and N$_2$, each at a flow rate of 250 sccm, 250 sccm, and 100 sccm, respectively. A side wall 34 was formed on the side wall of the polysilicon layer 24 by anisotropically etching the thus deposited SiO$_2$ layer, as is shown in FIG. 4(B). The anisotropic etching can be conducted, for example, using a C$_4$F$_8$ gas being flown at a rate of 50 sccm and at a pressure of 2 Pa, while applying RF power at 1,200 W. In this manner, a gate contact area 26 comprising a polysilicon layer 24, a side wall 34, and a gate oxide film 22 can be formed. A channel made of silicon film 20 can be found under the gate contact area, with a CoSi$_2$ layer 18 being established further below the silicon film 20.

[Process step 175]

Figure 4C:
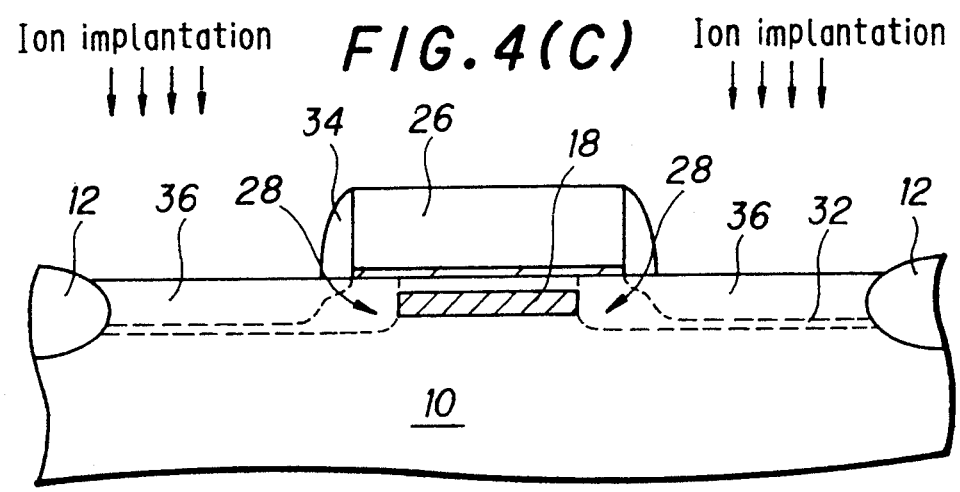

Source.drain regions 36 illustrated in FIG. 4(C) were then formed by ion implantation under conditions, for example, implanting As+ at an energy of 50 KeV and at a fluence of $3 \times 10^{15}$ ions/cm$^2$ for an NMOS, or BF$_2$+ at an energy of 20 KeV and at a fluence of $1 \times 10^{15}$ ions/cm$^2$ in the case of a PMOS.

[Process step 180]

A 500 nm thick interlevel insulator layer 40 made of SiO$_2$ was deposited thereafter by CVD under conditions of, for example, flowing a mixed gas comprising SiH$_4$, O$_2$, and N$_2$ each at a flow rate of 250 sccm, 250 sccm, and 100 sccm, respectively, a temperature of 420° C., and a pressure of 13.3 Pa. This was followed by annealing for 10 seconds in N$_2$ at 1,100° C. In this manner, the impurities can be diffused to establish a junction.

[Process step 185]

Figure 5A:
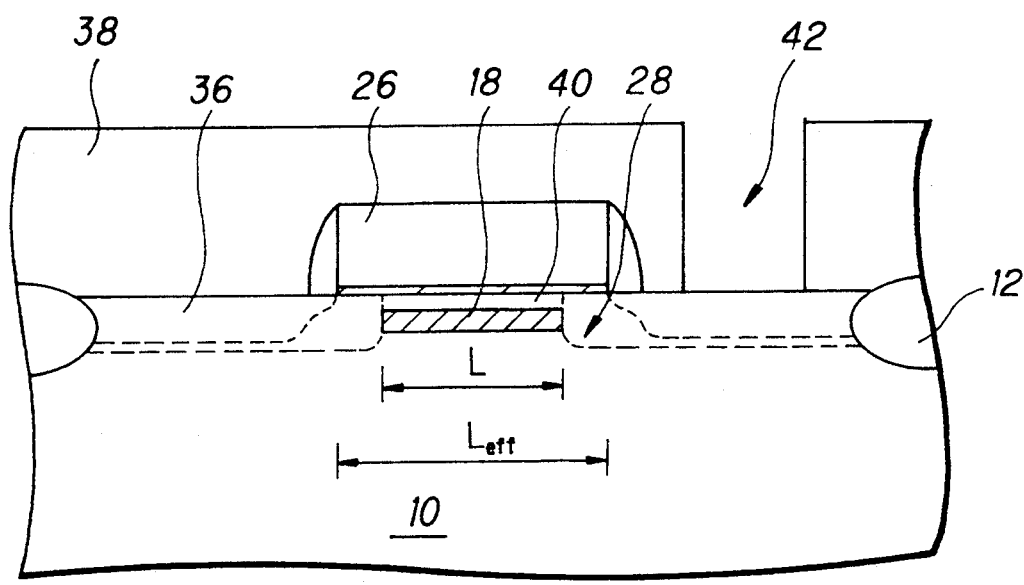
FIG. 5(A)-FIG.(B) is a schematically shown cross sectional view of a semiconductor element, for use as an explanatory means for describing the process steps subsequent to those of FIG. 4 in the fabrication of a semiconductor device according to the present invention.

After resist patterning, an opening 42 was provided in the interlevel insulator layer 40 by dry etching having conducted by, for example, flowing C$_4$F$_8$ gas at a rate of 50 sccm at an RF power of 1,200 W, and under a pressure of 2 Pa. The structure thus obtained is shown in FIG. 5(A).

[Process step 190]

Figure 5B:
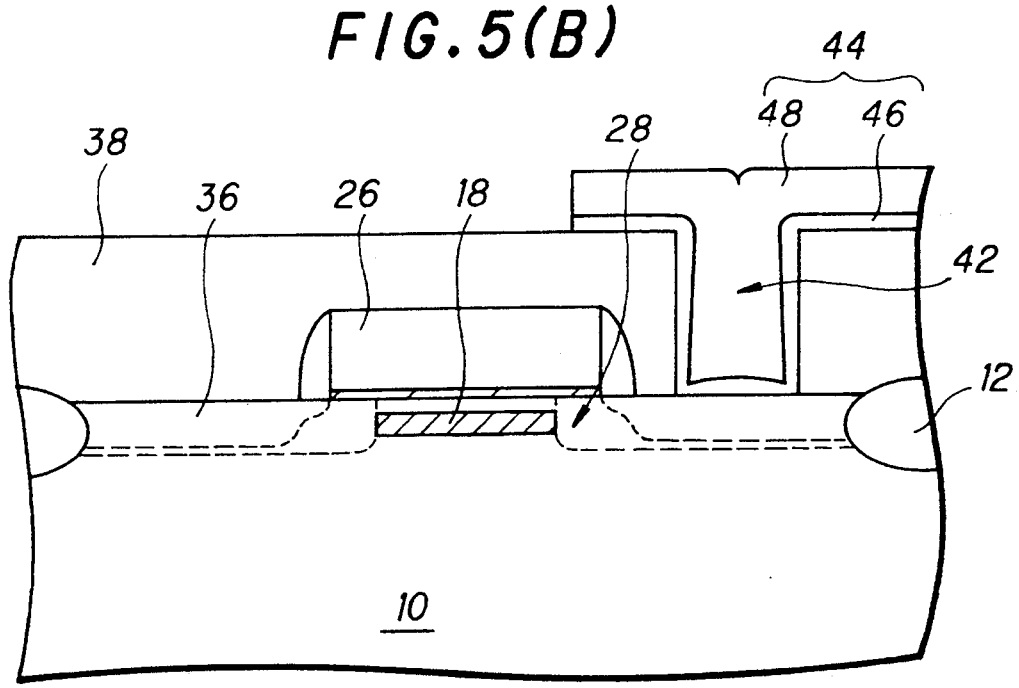

A connection layer 44 shown in FIG. 5(B) was then formed. The connection layer was composed of four layers, which are in the order from the lower side of, a three layered Ti/TiON/Ti 46, and an Al—1% Si layer 48. These layers can be deposited by sputtering under conditions of, for example, flowing Ar gas at a flow rate of 40 sccm, a DC sputtering power of 1 KW, a pressure of 0.4 Pa, and a film deposition temperature of 150° C., in the case of forming the Ti layer. The TiON layer can be deposited by sputtering using, for example, a gas mixture of Ar and N$_2$—6% O$_2$ each being flown at a rate of 40 sccm and 70 sccm, respectively, at a DC sputtering power of 5 kW under a pressure of 0.4 Pa, and while maintaining the temperature at 150° C. during the film deposition. The Al-1%Si layer can be deposited at a rate of 800 nm/minute to a thickness of 800 nm, by using, for example, Ar gas being flown at a rate of 40 sccm, applying a DC sputtering power of 6 kW and under a pressure of 0.4 Pa. This process was followed by resist patterning, and connection was established by dry etching the connection layer 44. The dry etching can be conducted using an RF-applied ECR etcher, for example, by using a mixed gas flow of BCl$_3$ and Cl$_2$ each at a flow rate of 60 sccm and 90 sccm, respectively, and applying a microwave power of 1 kW and a DC sputtering power of 1 kW, while introducing Ar gas at a flow rate of 40 sccm and applying an RF power of 50 W under a pressure of 13.3 Pa.

In this manner, a complete semiconductor device shown in FIG. 1 can be obtained. The semiconductor device thus obtained comprises a semiconductor substrate 10 having formed therein a channel region 38, and is characterized by that the channel region 38 comprises (A) a channel made from a silicon film 20, and (B) a CoSi$_2$ layer 18 at least a part of which is included in said channel.

The epitaxially grown CoSi$_2$ layer 18 on the semiconductor substrate 10 has therefore an extremely high electric conductivity. The length L of the CoSi$_2$ layer 18 along the channel is shorter than the effective length L$_{eff}$ of the channel region 38, and an Si intermediate region 28 is established between the CoSi$_2$ layer 18 and the source.drain regions 36 neighboring the CoSi$_2$ layer 18.

At least a part of the intermediate region 28 is impurity-doped by oblique incident ion implantation. The impurity being introduced into the intermediate region 28 must be of the same type of impurities as those being incorporated in the well of the semiconductor substrate.

EXAMPLE 2

In the present example, the layer of a compound comprising a constituent material (Si) of the semiconductor substrate and a metal (Co) is a cobalt silicide (CoSi$_2$) layer 18. This layer was grown epitaxially with respect to the silicon semiconductor substrate. The length of the compound layer comprising CoSi$_2$ layer 18 is shorter than the effective length of the channel region, and Si, which is a constituent material of the semiconductor substrate, is left in the intermediate region 28 being located between the CoSi$_2$ layer 18 and a layer neighboring thereto, i.e., the source.drain regions 36. At least a part of the intermediate region is impurity-doped to minimize Schottky barrier.

In the present Example, impurities are introduced in a manner differing to that used in Example 1. Furthermore, the impurities are introduced by a process comprising steps differing in order as compared to the one described in Example 1. Furthermore, in the present Example, a TiSi$_2$ layer is formed on the gate contact area and the source.drain regions.

Figure 6A:
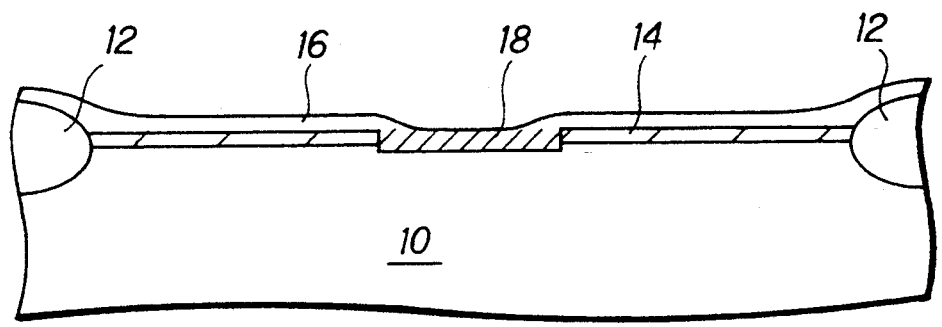
Figure 6A:
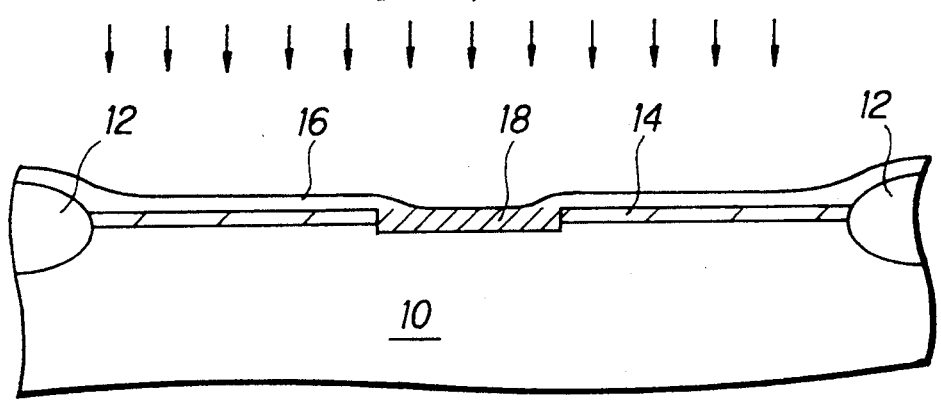
Figure 6C:
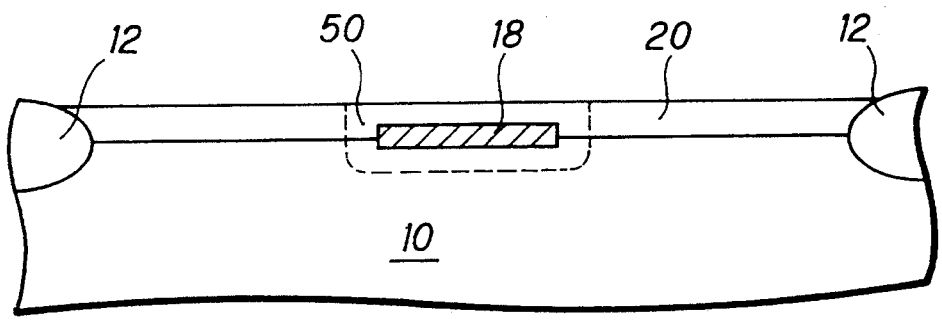
Figure 7A:
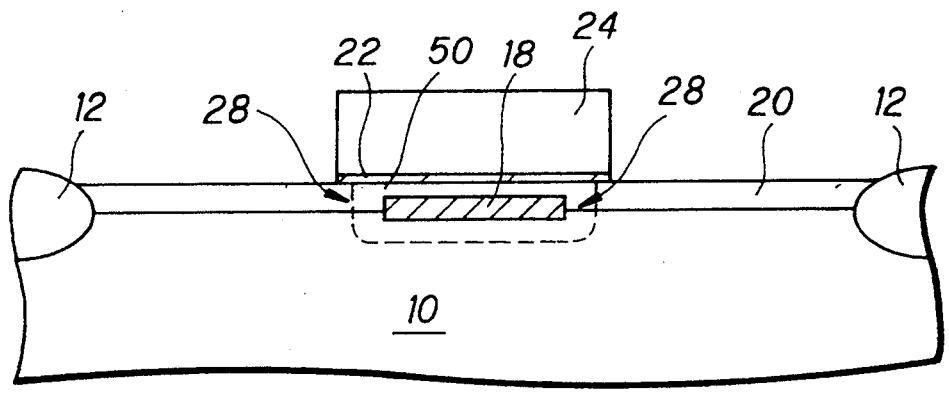
FIG. 7(A)-FIG. 7(C) is a schematically shown cross sectional view of a semiconductor element, for use as an explanatory means for describing the process steps subsequent to those of FIG. 6 in the fabrication of a semiconductor device according to the present invention.

Referring to FIGS. 6 to 8, the steps according to the process of the present. Example are briefly described below.

[Process step 200 to Process step 210]

A metallic layer 16 was deposited on an area assigned to a gate contact area. This metallic layer 16 was then allowed to react with a constituent material (Si) of the semiconductor substrate to thereby establish a compound (silicide) layer 18. The compound (silicide) layer 18 was then grown epitaxially on the semiconductor substrate. In this step, the compound layer is formed shorter in length than the area defined as an area for forming thereon a gate contact area.

[Process step 220 to Process step 230]

The compound layer 18 was impurity-doped by ion implantation to thereby minimize the Schottky barrier in the intermediate layer 28 being incorporated between the compound layer 18 and the area neighboring thereto, i.e., the area assigned to source.drain regions.

[Process step 240 to Process step 270]

A silicon film 20 for a channel was formed, which was followed by the formation of a gate contact area. The impurities having introduced into the compound layer 18 diffuse into the silicon film 20 and the semiconductor substrate 10 during the formation of the silicon film 20. In this manner, the Schottky barrier between the intermediate region 28 and the surrounding Si can be reduced.

[Process step 280]

A TiSi$_2$ layer 52 was deposited on the gate contact area 26 and the area assigned to an area for establishing thereon source.drain regions.

The process for fabricating the semiconductor device described briefly above is explained in further detail below.

[Process step 200]

Element isolation regions 12 were established on a silicon semiconductor substrate 10, and after forming an oxide film 14 at a thickness of 10 nm over the entire surface of the semiconductor substrate, the oxide film was removed partially from areas corresponding to those on which CoSi$_2$ layer is formed in the subsequent step. This step can be conducted in the same manner as in [Process step 100] described in Example 1.

[Process step 210]

A 10 nm thick Co layer 16 was deposited over the entire surface. Simultaneously with the film deposition, the semiconductor substrate was heated to about 800° C. to form an epitaxially grown CoSi$_2$ layer 18. Similar process conditions as those used in [Process step 110] of Example 1 can be used as well. A schematic cross sectional view of the semiconductor device thus obtained is shown in FIG. 6.

[Process step 220]

The CoSi$_2$ layer 18 and the Co layer 16 were each entirely and heavily doped to thereby minimize Schottky barrier between the CoSi$_2$ layer 18 and the surrounding Si (which is formed in the subsequent step) having formed on the area assigned to and area for forming therein channel regions. This step is different from the steps included in the process of Example 1. Thus is obtained a structure shown in FIG. 6(B). The ion implantation can be conducted by, for example, implanting BF$_2$+ at an energy of 10 KeV and at a fluence of $1 \times 10^{15}$ ions/cm$^2$ for an NMOS, or As+ at an energy of 10 KeV and at a fluence of $5 \times 10^{15}$ ions/cm$^2$ in the case of a PMOS. The ions are preferably implanted at a dose of $1 \times 10^{13}$ ions/cm$^2$ or more to facilitate the establishment of an electric contact between the CoSi$_2$ layer 18 and the silicon film which is formed in the subsequent step. The impurity to be implanted must be the same type of impurity as that included in the well of the semiconductor substrate.

[Process step 230]

The Co layer 16 in excess was removed, and also the oxide film 14 was removed thereafter. This step can be conducted in the same procedure as that of [Process step 120] in Example 1.

[Process step 240]

A 10 nm thick silicon epitaxial film 20 was grown selectively on the surface of Si and CoSi$_2$ layer 18 on the silicon semiconductor substrate having a partially exposed surface. Thus was obtained a structure shown in FIG. 6(C). This step can be conducted by a procedure similar to that of [Process step 130] as is described in Example 1. During the epitaxial growth of the silicon film 20, the impurities having implanted into the CoSi$_2$ layer diffuse into the semiconductor substrate 10 and the silicon film 20. This diffusion region is indicated with numeral 50 in FIG. 6(C). In this manner, the Schottky barrier between the CoSi$_2$ layer 18 and the surrounding Si having formed on the area assigned to the channel region. The silicon film 20 on the CoSi$_2$ layer serves as a channel in the channel region.

[Process step 250]

The surface of the thus grown silicon film 20 was oxidized to form a gate oxide film 22. Subsequently, a 200 nm thick polysilicon layer 24 was deposited on the gate oxide film 22 to establish a gate electrode area. The polysilicon layer 24 was etched thereafter to leave out a part of the polysilicon layer 24 which corresponds to the gate contact area. Thus was obtained a structure shown in FIG. 7(A). This step corresponds to the steps [Process step 130] and [Process step 140] in Example 1.

The important point in this step is that the polysilicon layer 24 obtained after the etching step is longer in length than the CoSi$_2$ layer 18. That is, an intermediate region 28 comprising a constituent material (Si) of the semiconductor substrate is established between the region assigned to source.drain regions and the CoSi$_2$ layer 18. By taking such a structure, a short circuit between the source and drain regions due to the presence of the CoSi$_2$ layer 18 can be prevented from occurring when the transistor is in the OFF state. Furthermore, the impurities having introduced into the CoSi$_2$ layer 18 by ion implantation diffuses into the intermediate region 28.

[Process step 260]

Figure 7B:
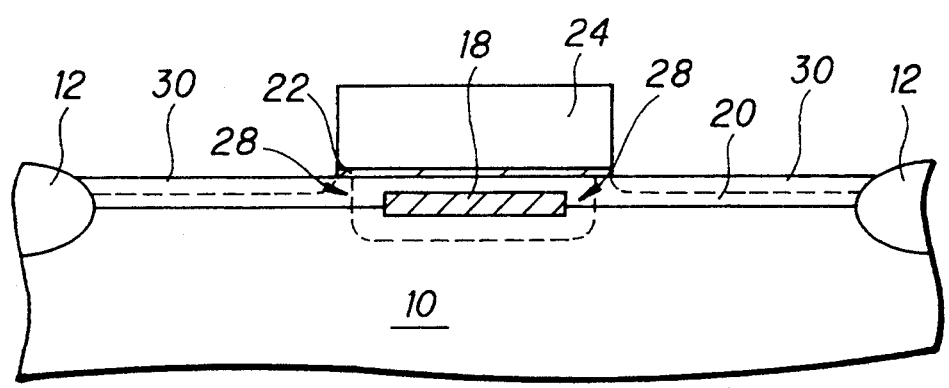

The structure thus obtained was then subjected to ion implantation to obtain an LDD (lightly doped drain) structure as in FIG. 7(B). The ion implantation process can be conducted by bombarding the structure, for example, with As+ at an energy of 40 KeV and at a fluence of $1 \times 10^{14}$ ions/cm$^2$ for an NMOS, or with BF$_2$+ at an energy of 30 KeV and at a fluence of $5 \times 10^{13}$ ions/cm$^2$ in the case of a PMOS.

[Process step 270]

Figure 7C:
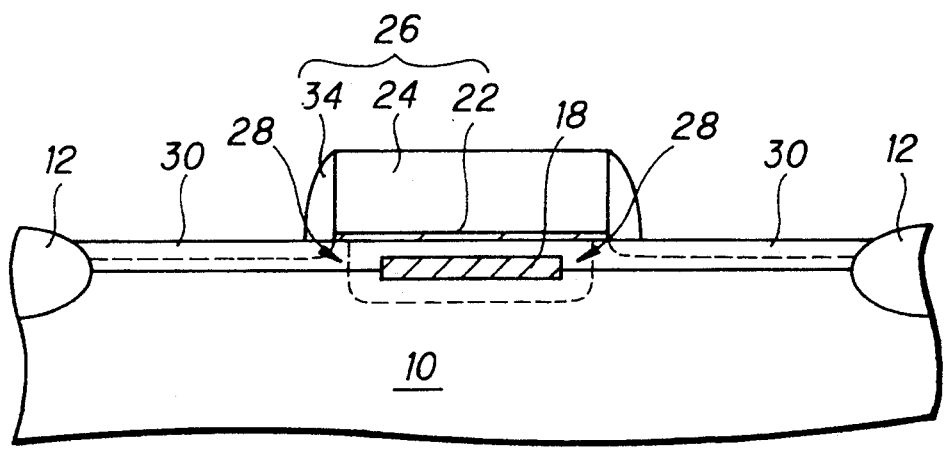

A 400 nm thick SiO$_2$ layer was deposited over the entire structure, and a side wall 34 was formed on the side wall of the polysilicon layer 24 by anisotropically etching the thus deposited SiO$_2$ layer, as is shown in FIG. 7(C)o This step can be conducted in the same manner as that of [Process step 170] of Example 1.

[Process step 280]

This step differs from any step included in the process of Example 1. Specifically, a 30 nm thick titanium (Ti) layer was formed by sputtering. The sputtering can be conducted by, for example, flowing Ar gas at a flow rate of 40 sccm while applying an RF bias of −50 W and a DC sputtering power of 1 kW under a pressure of 0.4 Pa. The deposition temperature in this process may be set at, for example, 200° C. to thereby effect deposition at a rate of 60 nm/minute. The thus deposited Ti layer was then subjected to a first RTA (rapid thermal annealing) in an inert gas (e.g., N$_2$) at 650° C. for a duration of 30 seconds. Thus was a TiSi$_x$ layer established. The remaining unreacted Ti was removed selectively by immersing the semiconductor substrate into an aqueous solution of ammonia (NH$_4$OH) and hydrogen peroxide (H$_2$O$_2$) for a duration of 10 minutes. A second RTA was conducted on the resulting TiSi$_x$ layer in an inert gas (e.g., N$_2$) at 900° C. for a duration of 30 seconds to obtain a stable titanium silicide (TiSi$_2$) layer 52 having low resistance from the TiSi$_x$ layer. In this manner, a TiSi$_2$ layer 52 is established on the gate contact area 26 and the area assigned to source.drain regions.

[Process step 285]

Figure 8A:
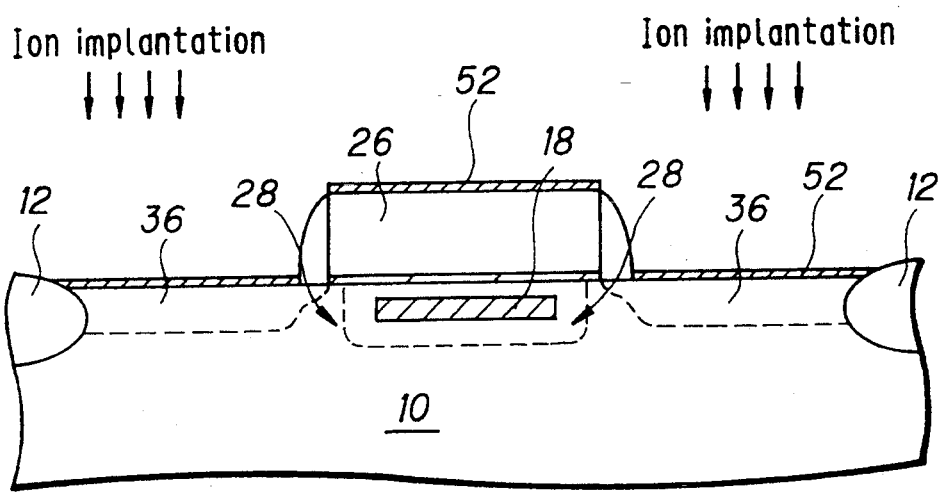
FIG. 8(A)-FIG. 8(B) is a schematically shown cross sectional view of a semiconductor element, for use as an explanatory means for describing the process steps in the fabrication of a semiconductor device according a third embodiment to the present invention.

Source.drain regions 36 illustrated in FIG. 8(A) were then formed by ion implantation. Then, a 500 nm thick interlevel insulator layer 40 made of SiO$_2$ was deposited thereafter by CVD. This was followed by annealing for 10 seconds in N$_2$ at 1,100° C. In this manner, the impurities can be diffused to establish a junction while simultaneously activating the TiSi$_2$ layer 52. Since a uniform TiSi$_2$ layer is provided selectively on the source.drain regions and on the gate contact, a sheet resistance as low as 8 Ω/sq can be realized. After resist patterning, an opening 42 was provided in the interlevel insulator layer 40 by dry etching. These steps are essentially the same as those of [Process step 175], Process step 180], and [Process step 185] in Example 1.

[Process step 290]

Figure 8B:
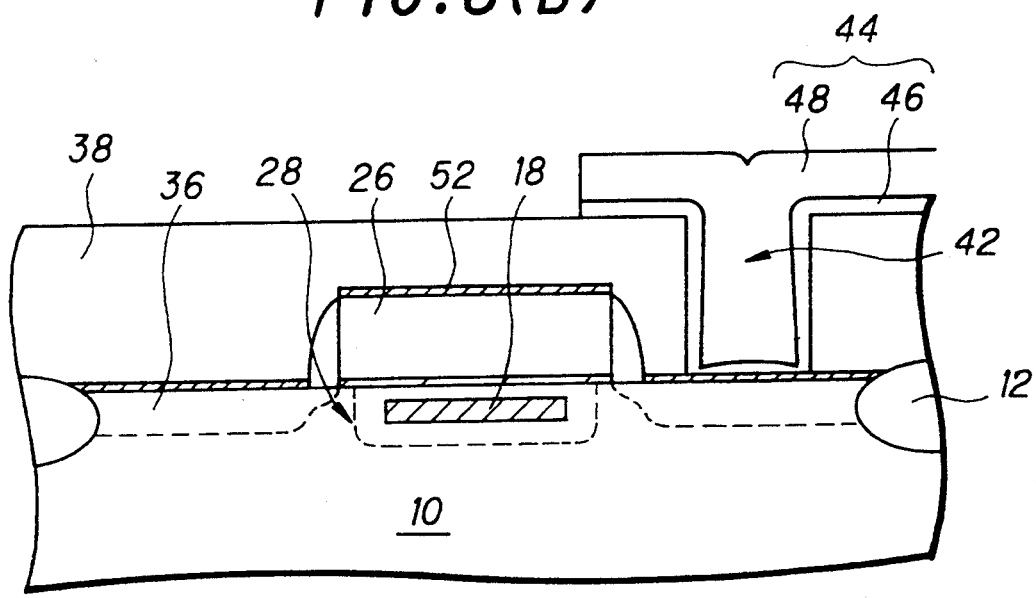

A connection layer 44 shown in FIG. 8(B) was then formed. This was followed by resist patterning, and connection was established by dry etching the connection layer 44. This step is the same as [Process step 190] described in Example 1.

Before establishing the connection layer 44, it is preferred that a Ti nitride such as TiF$_3$ having formed as a by-product during the step of forming an opening in the interlevel insulator layer is removed selectively by immersing the semiconductor substrate into an aqueous solution of ammonia (NH$_4$OH) and hydrogen peroxide (H$_2$O$_2$) containing NH$_4$OH, H$_2$O$_2$, and H$_2$O at an NH$_4$OH:H$_2$O$_2$O ratio of 1:2:7 for a duration of 10 minutes.

EXAMPLE 3

In the present example again, the layer of a compound comprising a constituent material (Si) of the semiconductor substrate and a metal (Co) is a cobalt silicide (CoSi$_2$) layer 18. This layer was grown epitaxially with respect to the silicon semiconductor substrate. The length of the compound layer comprising CoSi$_2$ layer 18 is shorter than the effective length of the channel region, and Si, which is a constituent material of the semiconductor substrate, is left in the intermediate region 28 being located between the CoSi$_2$ layer 18 and a layer neighboring thereto, i.e., the source.drain regions 36. At least a part of the intermediate region is impurity-doped to minimize Schottky barrier.

In the present Example, impurities are introduced by oblique incident ion implantation as in Example 1, but it differs from the process of Example 1 in details. In the process according to the present example, a side wall is established on the side wall of the gate contact area, which is followed by the formation of a TiSi$_2$ layer on the source.drain regions as well as on the gate contact area, and by exposing the intermediate region by selectively etching the side wall alone. Then, the oblique incident ion implantation is conducted using the TiSi$_2$ layer having formed on the gate contact area and the source.drain regions as the mask.

Figure 9A:
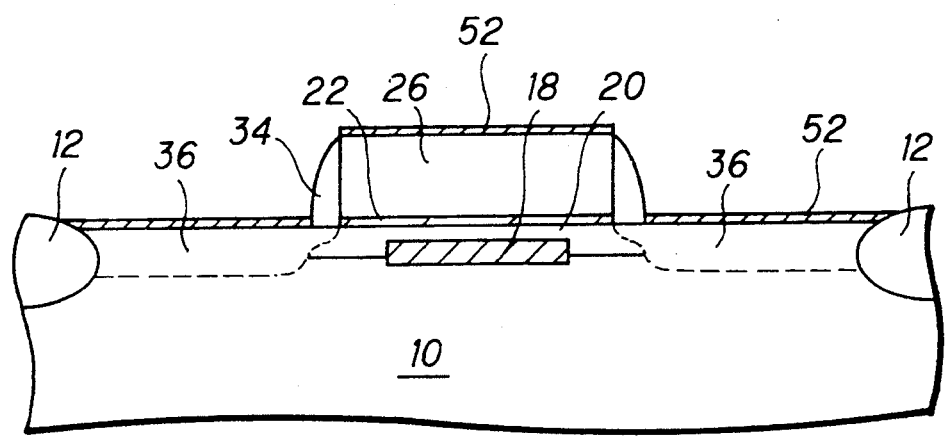
FIG. 9(A)-FIG. 9(C) is a schematically shown cross sectional view of a semiconductor device according to another embodiment of the present invention.
Figure 9B:
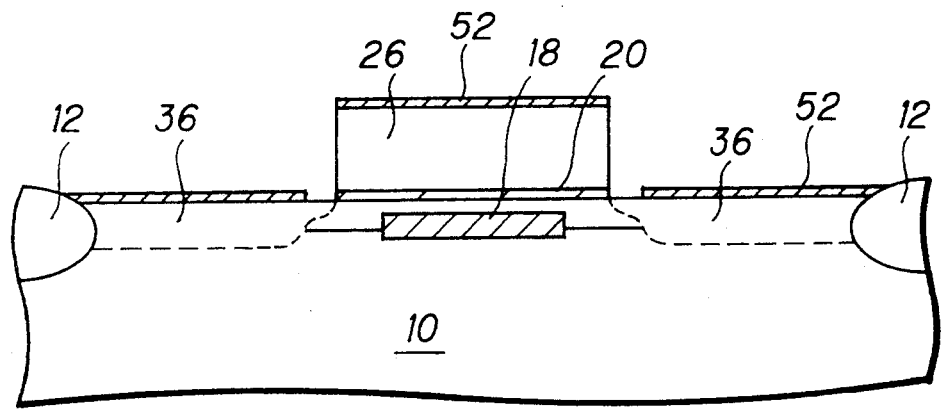
Figure 9C:
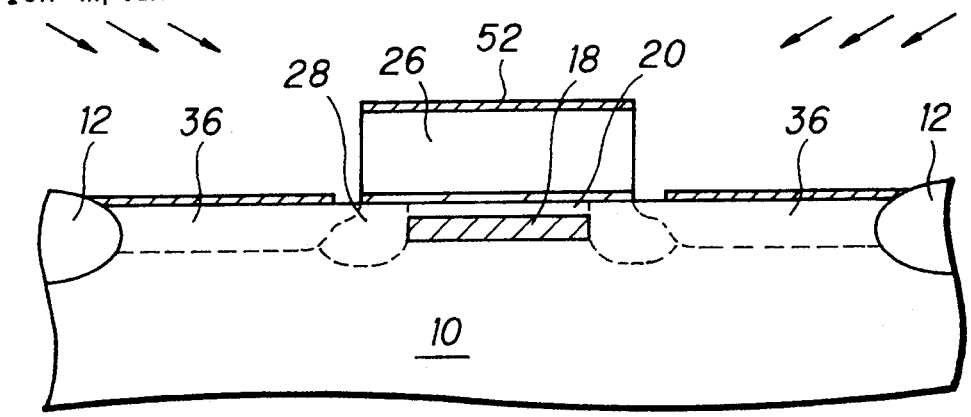

Referring to FIG. 9, the steps according to the process of the present Example are briefly described below.

[Process step 300]

A metallic layer 16 was deposited on an area assigned to a gate contact area. This metallic layer 16 was then allowed to react with a constituent material (Si) of the semiconductor substrate to thereby establish a compound (silicide) layer 18. The compound (silicide) layer 18 was then grown epitaxially on the semiconductor substrate. In this step, the compound layer is formed shorter in length than the area defined as an area for forming thereon a gate contact area. This step was followed by forming a gate contact area 26 inclusive of a side wall 34.

[Process step 310 to Process step 320]

Source.drain regions 36 was established after depositing a TiSi$_2$ layer 52 on the gate contact area 26 and the area assigned to source.drain regions.

[Process step 330]

The side wall 34 was removed.

[Process step 340]

An impurity was introduced into an intermediate region 28 having provided between the CoSi$_2$ layer and the source.drain regions to thereby minimize Schottky barrier between the intermediate region 28 and the surrounding Si.

The process for fabricating the semiconductor device described briefly above is explained in further detail below.

[Process step 300]

As in FIG. 2, element isolation regions 12 were established on a silicon semiconductor substrate 10 by a conventional method, and after forming an oxide film 14 at a thickness of 10 nm over the entire surface of the semiconductor substrate, the oxide film was removed partially from areas corresponding to those on which CoSi$_2$ layer is formed in the subsequent step. This step can be conducted in the same manner as in [Process step 100] described in Example 1.

[Process step 310]

A 5 nm thick Co layer 16 was deposited over the entire surface. Simultaneously with the film deposition, the semiconductor substrate was heated to about 800° C. to form an epitaxially grown CoSi$_2$ layer 18. Similar process conditions as those used in [Process step 110] of Example 1 can be used in this step. The Co layer 16 in excess was removed, and also the oxide film 14 was removed thereafter. This step can be conducted in the same procedure as that of [Process step 120] in Example 1.

A 10 nm thick silicon epitaxial film 20 was grown selectively on the surface of Si and CoSi$_2$ layer 18 on the silicon semiconductor substrate having a partially exposed surface. The surface of the thus grown silicon film 20 was oxidized to form a gate oxide film 22. This step can be conducted in a manner similar to [Process step 130] described in Example 1.

Subsequently, a 200 nm thick polysilicon layer 24 was deposited on the gate oxide film 22 to establish a gate electrode area. The polysilicon layer 24 was etched thereafter to leave out a part of the polysilicon layer 24 which corresponds to the gate contact area. This step can be carried out in a similar manner as in [Process step 140] in Example 1.

The important point here is that the polysilicon layer 24 obtained after the etching step is longer in length than the CoSi$_2$ layer 18. That is, an intermediate region 28 comprising a constituent material (Si) of the semiconductor substrate is established between the region assigned to source.drain regions and the CoSi$_2$ layer 18. By taking such a structure, a short circuit between the source and drain regions due to the presence of the CoSi$_2$ layer 18 can be prevented from occurring when the transistor is in the OFF state.

The structure thus obtained was then subjected to ion implantation to obtain an LDD (lightly doped drain) structure. The conditions of the ion implantation can be set similar to those employed in [Process step 170] of Example 1.

A 400 nm thick SiO$_2$ layer was deposited over the entire structure, and a side wall 34 was formed on the side wall of the polysilicon layer 24 by anisotropically etching the thus deposited SiO$_2$ layer. This step can be conducted in the same manner as that of [Process step 170] in Example 1.

[Process step 310]

A 30 nm thick titanium (Ti) layer was formed by sputtering. The thus deposited Ti layer was then subjected to RTA, and the remaining unreacted Ti was removed selectively. The conditions for those treatments are the same as those used in [Process step 280] in Example 2. In this manner, a TiSi$_2$ layer 52 is established on the gate contact area 26 and the area assigned to source.drain regions. No TiSi$_2$ layer is deposited on the side wall 34.

[Process step 320]

Source.drain regions 36 were then formed by ion implantation. The ion implantation process can be conducted under the same conditions as those employed in [Process step 175] in Example 1. A schematically shown cross sectional view of the semiconductor device thus obtained is given in FIG. 9(A).

[Process step 330]

This is a particular step in the present example. In this step, the side wall 34 is removed by dry etching to obtain a structure shown in FIG. 9(B). The etching can be conducted, for example, by flowing C$_4$F$_8$ gas at a flow rate of 50 sccm while applying an RF power of 1,200 W under a pressure of 2 Pa.

[Process step 340]

A heavily doped region including a part of the intermediate layer 28 was established by oblique incident ion implantation to minimize Schottky barrier between the CoSi$_2$ layer 18 and the surrounding Si. Thus was obtained a structure shown in FIG. 9(C). The ion implantation can be effected by, for example, implanting BF$_2^+$ at an energy of 20 KeV and at a fluence of $1 \times 10^{15}$ ions/cm$^2$ for an NMOS, or As$^+$ at an energy of 30 KeV and at a fluence of $5 \times 10^{15}$ ions/cm$^2$ in the case of a PMOS. The oblique incident ion implantation can be conducted by, for example, bombarding a semiconductor substrate being rotated at 30 rpm with ions at an incident angle of 60 degree. The ions are preferably implanted at a dose of about $1 \times 10^{13}$ ions/cm$^2$ or more to facilitate the establishment of an electric contact between the CoSi$_2$ layer 18 and the surrounding Si. The TiSi$_2$ layer 52 having formed on the source.drain regions 36 and on the gate contact 26 functions as a mask during the oblique incident ion implantation.

[Process step 350]

Then, a 500 nm thick interlevel insulator layer 40 made of SiO$_2$ was deposited thereafter by CVD. This was followed by annealing for 10 seconds in N$_2$ at 1,100° C. In this manner, the impurities can be diffused to establish a junction while simultaneously activating the TiSi$_2$ layer 52. Since a uniform TiSi$_2$ layer is provided selectively on the source.drain regions and on the gate contact, a sheet resistance as low as 8 Ω/sq can be realized. After resist patterning, an opening 42 was provided in the interlevel insulator layer 40 by dry etching. A connection layer 44 was then formed. This was followed by resist patterning, and connection was established by dry etching the connection layer 44. These steps are essentially the same as those through [Process step 180] to [Process step 190] described in Example 1. Before establishing the connection layer 44, it is preferred that a Ti nitride such as TiF$_3$ having formed as a by-product during the step of forming an opening in the interlevel insulator layer is removed selectively by immersing the semiconductor substrate into an aqueous solution of ammonia and hydrogen peroxide.

The semiconductor device according to the present invention was described in detail referring to some preferred embodiments. However, the present invention is not limited only thereto. The process conditions and values referred in each of the embodiments are provided as examples, and they are subject to changes depending on the type and kind of apparatus to be used in the fabrication process and on the characteristics desired on the individual semiconductor device.

The CoSi$_2$ layer 18 as the compound layer may be replaced by a layer of a compound having lattice parameters concordant with those of Si. Specific examples of such compounds include ZrSi$_2$, NiSi$_2$, and PdSi$_2$. Otherwise, a metal which is capable of forming an epitaxial film on Si, e.g., aluminum, may be used in the place of CoSi$_2$. Furthermore, the TiSi$_2$ layer 52 may be replaced by silicide layers such as of CoSi$_2$, WSi$_2$, and MoSi$_2$; high melting metals such as W and Mo; and barrier metals such as TiN, TiB, and TiW.

Figure 10A:
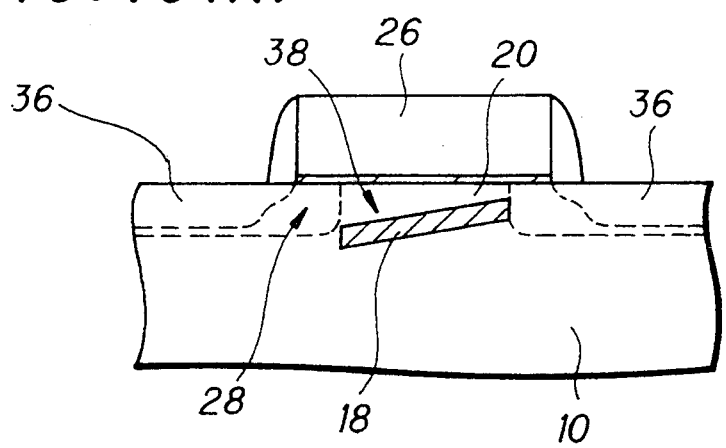
FIG. 10(A)-FIG. 10(B) is a schematically drawn cross sectional view of a semiconductor device obtained as a modification of one shown in FIG. 1.
Figure 10B:
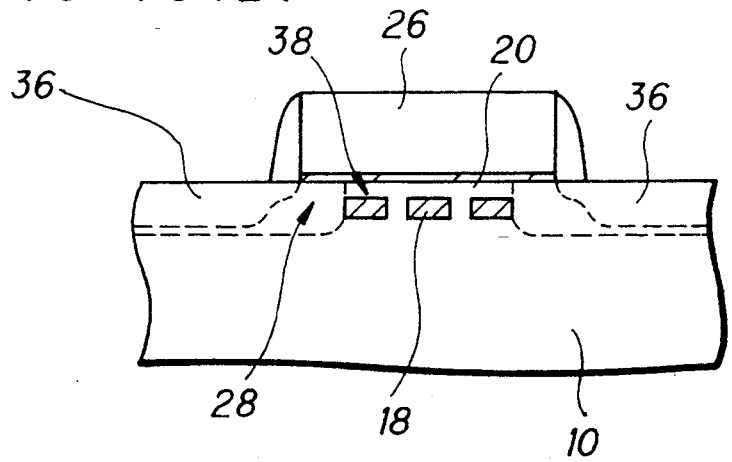

The thickness of the silicon layer 20 having formed between the metallic layer or the compound layer 18 and the gate oxide layer 22 need not be of uniform thickness. FIG. 10(A) shows that the position of the metallic or compound layer 18 is variable along the depth direction depending on the profile of the channel. The metallic or compound layer 18 may be wholly included in the channel. Furthermore, the metallic or compound layer 18 may take a multilayered structure. Moreover, the metallic or compound layer along the longitudinal direction of the channel need not be limited to a single layer, but a plurality of layers may be formed along the direction of channel length. This structure is illustrated in FIG. 10(B).

Figure 11:
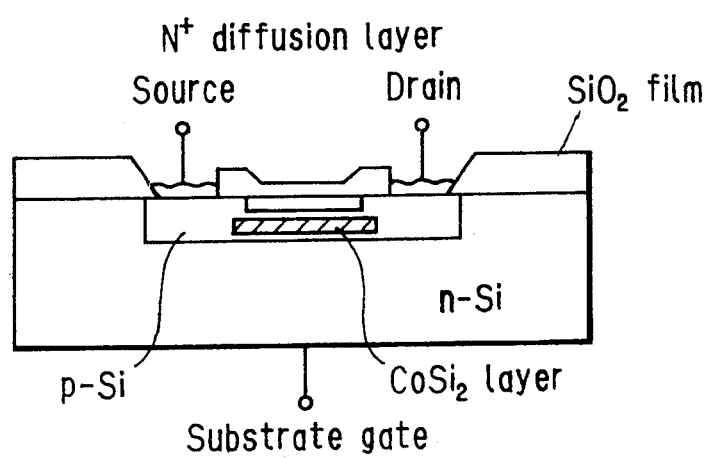
FIG. 11 is a schematically drawn cross sectional view of a part of a semiconductor device, a junction FET (field effect transistor) comprising a silicon semiconductor substrate, according to another embodiment of the present invention.

The foregoing description was made referring to a MOS semiconductor device. However, the present invention is applicable to junction FETs (JFETs) as well. A schematically drawn cross sectional view of a JFET to which the present invention is applied is given in FIG. 11. In this case, a metallic layer or a compound layer (e.g., a $CoSi_2$ layer) may be formed on a silicon semiconductor substrate. Alternatively, a GaAs substrate may be used so that a compound layer or metallic layer (such as of Cu (100) having an $A_3$ crystal structure) may be deposited thereon.

EXAMPLE 4

The present example relates to a JFET comprising a silicon semiconductor substrate having formed thereon a $CoSi_2$ compound layer. Referring to FIG. 12, the process for fabricating a JFET applying the present invention is described briefly below.

[Process step 400]

Figure 12A:
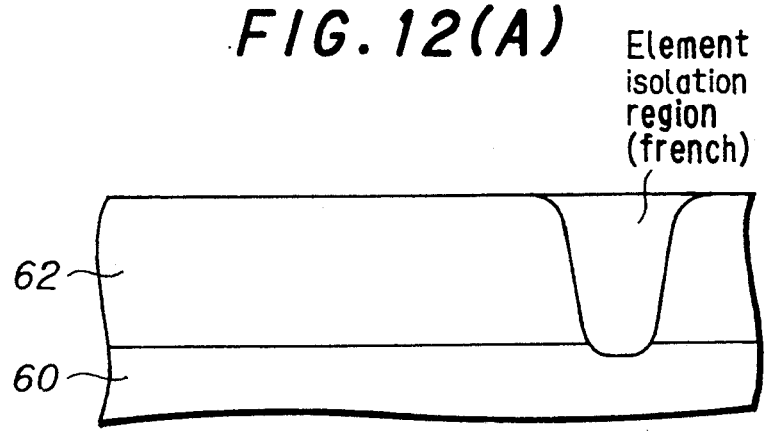
FIG. 12(A)-FIG. 12(C) is a schematically drawn cross sectional view of a part of a semiconductor element for use as an explanatory means for describing the process steps in the fabrication of a junction FET comprising a silicon semiconductor substrate.
Figure 12B:
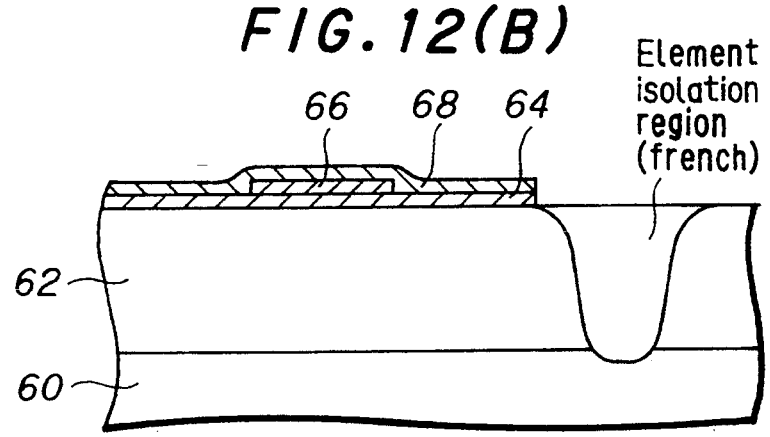

An n-silicon layer 62 was epitaxially grown on an n-silicon substrate 60. Then, LOCOS-structured element isolation regions were formed on the n-silicon layer 62. The resulting structure is shown in FIG. 12(A). The epitaxial n-silicon film can be obtained by, for instance, flowing a mixed gas of $SiH_4$, $H_2$, and 10ppm$PH_3$—$H_2$ each at a flow rate of 0.2 1, 100 1, and 10 sccm, respectively, at a temperature of 1,030° C. and at a pressure of 1 atom. Under such conditions, for example, an epitaxially grown n-silicon film 0.05 μm in thickness can be obtained at a film deposition rate of 0.1 μm.

[Process step 410]

A p-silicon layer 64 was epitaxially grown over the entire surface of the thus obtained structure. This layer was patterned, and then a $CoSi_2$ layer 66 was formed thereon. After also patterning the $CoSi_2$ layer, an epitaxial p-silicon layer 68 was deposited further on the entire surface thereof and patterned again. The sequence of the steps above results in a structure shown in FIG. 12(B). In this manner, a channel region comprising a p-channel and a compound layer made from $CoSi_2$ layer 66 being included in the p-channel is established. The p-silicon layers 64 and 68 may be epitaxially grown by, for example, flowing a mixed gas of $SiH_4$, $H_2$, and 10ppm$B_2H_6$—$H_2$ each at a flow rate of 0.2 1, 100 1, and 10 sccm, respectively, at a temperature of 1,030° C. and at a pressure of 1 atom. Under such conditions, for example, an epitaxial p-silicon film 0.05 μm in thickness can be obtained at a film deposition rate of 0.1 μm.

[Process step 420]

An n-silicon layer 70 was epitaxially grown over the entire surface of the thus obtained structure. This layer was patterned thereafter.

[Process step 430]

Figure 12C:
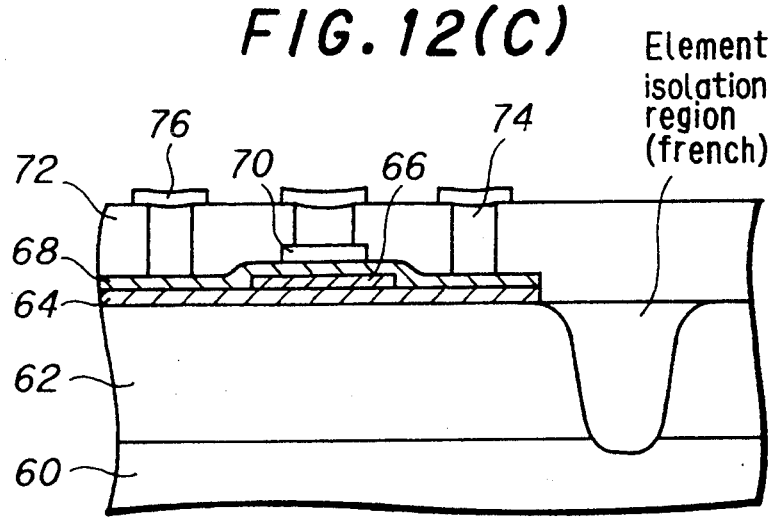

Then, an $SiO_2$ interlevel insulator layer 72 was deposited over the entire surface by, for example, a CVD process. An opening was formed on the resulting interlevel insulator layer 72 by a process such as dry etching. This opening was buried with a W/TiN plug 74, and an Al/Ti/TiON/Ti connection layer 76 was formed thereon. The resulting structure is illustrated in FIG. 12(C).

EXAMPLE 5

The present example relates to a JFET comprising a GaAs substrate having formed thereon a Cu (100) (having an $A_3$ crystal structure) metallic layer. Referring to FIG. 13, the process for fabricating a JFET applying the present invention is described briefly below.

[Process step 500]

A Cu layer 82 was formed on a GaAs substrate 80. The Cu layer having an $A_3$ crystal structure was obtained by allowing single crystal growth along the (100) crystallographic direction. The Cu film deposition can be conducted, for example, by flowing bis(hexafluoroacetylacetonato)copper [$Cu(HFA)_2$] gas at a rate of 100 sccm at a film deposition temperature of 200° C. or higher, to thereby obtain a Cu film 20 nm in thickness.

Figure 13A:
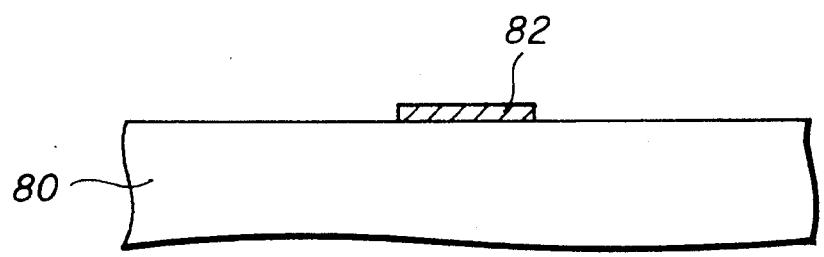
FIG. 13(A)-FIG. 13(C) is a schematically drawn cross sectional view of a part of a semiconductor element, for use as an explanatory means for describing the process steps in the fabrication of a junction FET comprising a GaAs substrate, according to another embodiment of the semiconductor device present invention; and of a semiconductor element, for use as an explanatory means for describing the process steps in the fabrication of a conventional semiconductor device.

The resulting Cu layer 82 was patterned by dry etching to obtain a structure shown in FIG. 13(A).

[Process step 510]

Figure 13B:
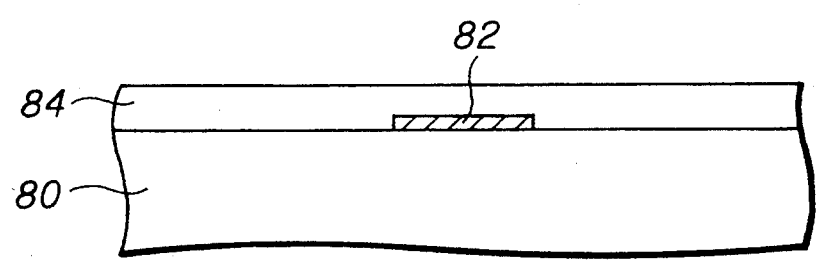
Figure 13C:
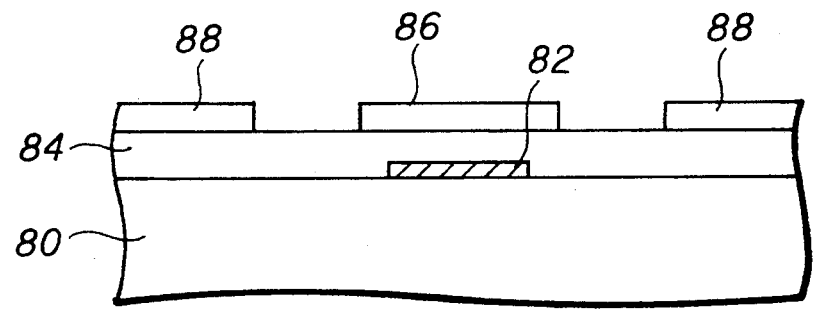
Figure 14A:
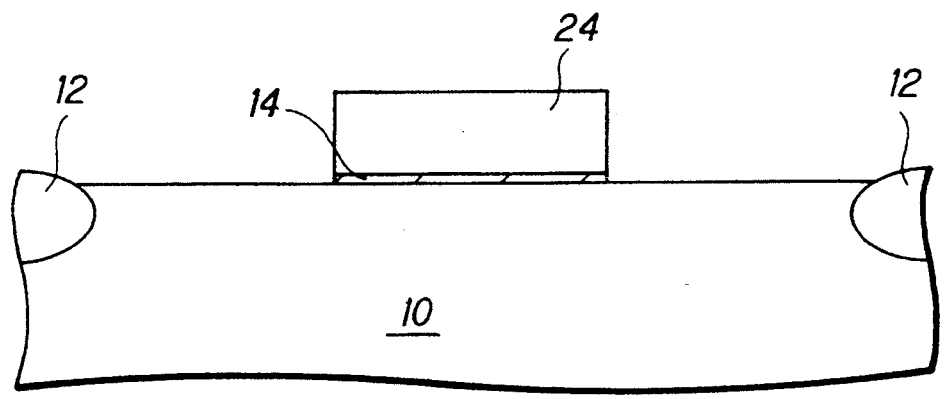
Figure 14B:
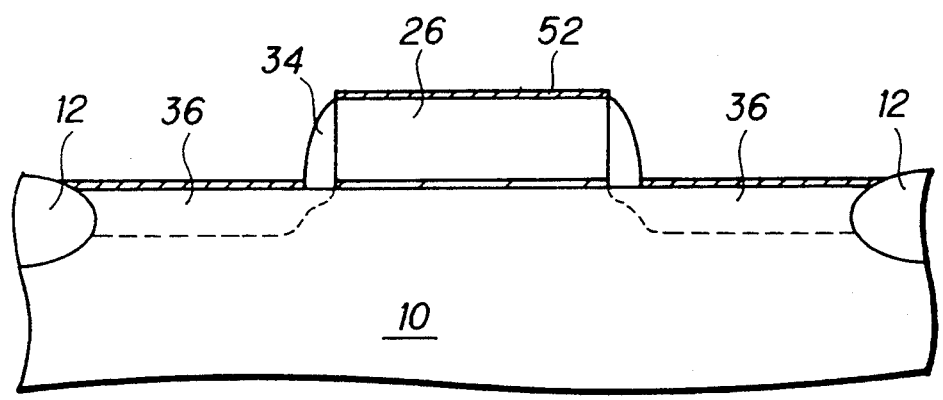
Figure 14C:
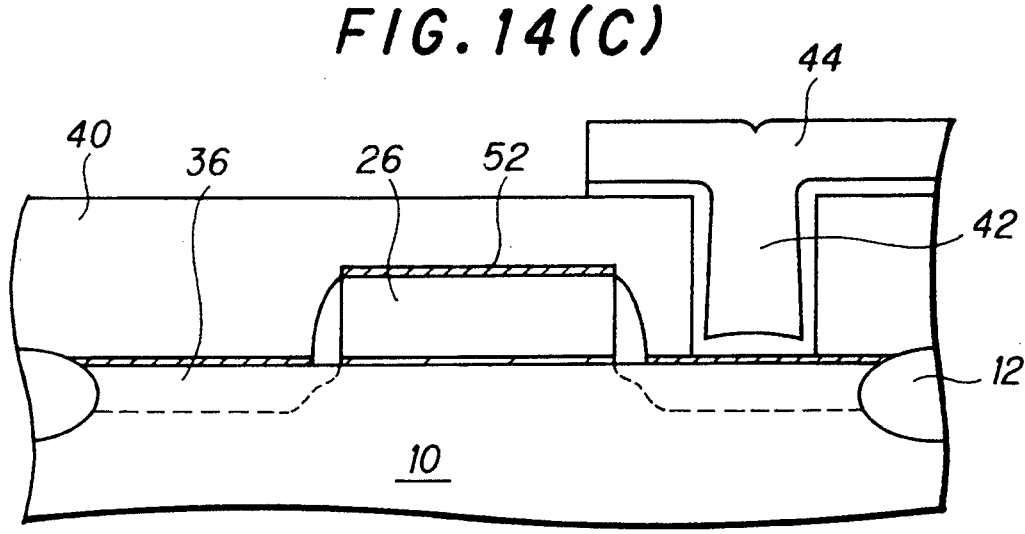

An epitaxial GaAs layer 84 was grown on the entire surface of the resulting structure. In this manner, a GaAs channel inclusive of at least a part of the Cu metallic layer 82 can be established to give a channel region. This structure is illustrated in FIG. 13(B).

[Process step 520]

An aluminum layer was deposited on the resulting structure and patterned to obtain an aluminum gate 86. An AuGe film was further deposited thereon and was subjected to patterning to establish a source and a drain 88. Thus was obtained a structure shown in FIG. 13(C).

As described in the foregoing, the semiconductor device according to the present invention comprises a metallic layer or a compound layer which at least a part thereof is included in the channel. Accordingly, the semiconductor device according to the present invention can be fabricated without changing the conventional design rules, but the carrier mobility therein is considerably increased to allow the transistor element to operate at an ever higher speed. That is, the epitaxially grown metallic or compound layer greatly elevates the electric conductivity of the metallic or compound layer itself.

Furthermore, the intermediate region having inserted between the metallic or compound layer and the source.drain regions neighboring thereto is requisite for imparting the ON-OFF characteristics same as that of a conventional transistor element to the device according to the present invention. In addition, the constituent material of the semiconductor substrate surrounding the metallic or compound layer is preferably doped with an impurity to thereby minimize the electric contact resistance between the metallic or compound layer and the surrounding material.

For instance, when a $CoSi_2$ layer is used as the compound layer, the resistance is lowered to about one hundredth of the value observed for Si. Specifically, the resistivity in the channel region which is measured about 1 mΩ.cm on using Si can be reduced to a mere 15 μΩ.cm by replacing Si with $CoSi_2$. Since the average velocity v of a carrier increases inversely proportional to the resistivity, the average velocity of the carrier can be considerably increased. Furthermore, since $CoSi_2$ develops no band gaps at the junction between $CoSi_2$ and Si when $CoSi_2$ is grown in the channel region, $CoSi_2$ can be utilized without controlling band gaps. It only requires the barrier height between $CoSi_2$ and Si to be adjusted. This control of barrier height can be conducted easily and yet with high precision by doping ions such as of As and B by ion implantation.

While the invention has been described in detail and with reference to specific embodiments thereof, it will be apparent to one skilled in the art that various changes and modifications can be made therein without departing from the spirit and scope thereof.

What is claimed is:

1. A semiconductor device which comprises a semiconductor substrate having thereon a field effect transistor with a channel region, said channel region comprising:
   (a) a channel, and
   (b) a metallic layer or a compound layer extending along the channel direction comprising a compound of a metal with a constituent material of the semiconductor substrate, provided that at least a part of said metallic layer or said compound layer is included in said channel,
   wherein the length of said metallic layer or said compound layer along the channel direction is shorter than the effective length of the channel region, and
   an intermediate region comprising a constituent material of the semiconductor substrate is incorporated between said metallic layer or sid compound layer and source drain regions adjacent to said metallic layer or said compound layer.

2. A semiconductor device as claimed in claim 1, wherein, said metallic layer or said compound layer is capable of being formed by epitaxial growth with respect to the semiconductor substrate.

3. A semiconductor device as claimed in claim 1, wherein, an impurity is introduced into at least a part of said intermediate region to thereby minimize Schottky barrier.

4. A semiconductor device as claimed in claim 3, wherein, said impurity is introduced at a concentration of $1 \times 10^{17}$ cm$^{-3}$ or higher.

5. A semiconductor device as claimed in claim 1, wherein, said metallic layer or said compound layer is a layer comprising a material selected from the group consisting of Al, Cu, $CoSi_2$, $ZrSi_2$, $NiSi_2$, and $PdSi_2$.

6. A semiconductor device as claimed in claim 1, wherein, said metallic layer or said compound layer is a layer having its position in the depth direction being adjusted in accordance with the channel profile along the channel direction.

7. A semiconductor device as claimed in claim 1, wherein, said metallic layer or said compound layer is a layer comprising a plurality of layers along the channel direction.

8. A semiconductor device as claimed in claim 1, wherein, said semiconductor device is a MOS field effect transistor.

9. A semiconductor device as claimed in claim 1, wherein, said semiconductor device is a junction field effect transistor.

10. A field effect transistor comprising:
    a semiconductor substrate of a first conductivity type;
    source and drain regions formed on a surface portion of the semiconductor substrate and spaced apart from one another, the source and drain regions being of a second conductivity type;
    channel region defined between the source and drain regions, the channel region comprising a semiconductor channel layer, a metallic layer or a compound layer which comprises a metal with a constituent material of the semiconductor substrate and intermediate semiconductor regions provided between the source and drain regions and the metallic layer or the compound layer.

11. A field effect transistor as claimed in claim 10, wherein said metallic layer in the compound layer have the length along the channel direction shorter than the effective length of the channel region.

12. A field effect transistor as claimed in claim 10, wherein said metallic layer or the compound layer is formed under the semiconductor channel layer.

13. A field effect transistor as claimed in claim 10, wherein said compound layer comprises a silicate.

* * * * *